(12) United States Patent
Clayton

(10) Patent No.: US 6,527,563 B2
(45) Date of Patent: Mar. 4, 2003

(54) GRID INTERPOSER

(76) Inventor: Gary A. Clayton, 11856 W. Driftwood Ct., Boise, ID (US) 83713

(*) Notice: Subject to any disclaimer, the term of this patent is extended or adjusted under 35 U.S.C. 154(b) by 0 days.

(21) Appl. No.: 09/912,111

(22) Filed: Jul. 23, 2001

(65) Prior Publication Data

US 2002/0039847 A1 Apr. 4, 2002

Related U.S. Application Data

(60) Provisional application No. 60/238,197, filed on Oct. 4, 2000.

(51) Int. Cl.[7] ............................................. H01R 12/00
(52) U.S. Cl. ................................. 439/66; 439/74
(58) Field of Search ........................ 439/65, 66–74, 439/526

(56) References Cited

U.S. PATENT DOCUMENTS

| | | | |
|---|---|---|---|
| 4,814,040 A | 3/1989 | Ozawa ..................... 156/634 |
| 5,083,697 A | 1/1992 | DiFrancesco ............... 228/116 |
| 5,207,585 A | 5/1993 | Byrnes et al. ............... 439/66 |
| 5,531,022 A * | 7/1996 | Beaman et al. ............. 29/850 |
| 5,919,050 A * | 7/1999 | Kehley et al. .............. 439/71 |
| 5,977,783 A | 11/1999 | Takayama et al. ......... 324/754 |
| 6,081,429 A | 6/2000 | Barrett ...................... 361/767 |
| 6,156,484 A | 12/2000 | Bassous et al. ............ 430/313 |
| 6,175,158 B1 | 1/2001 | Degani et al. ............. 257/777 |
| 6,176,707 B1 | 1/2001 | Neidich et al. ............. 439/66 |
| 6,188,231 B1 | 2/2001 | Palagonia .................. 324/754 |
| 6,191,474 B1 | 2/2001 | Kinsman et al. ........... 257/693 |
| 6,200,141 B1 | 3/2001 | Sinclair ..................... 439/66 |
| 2001/0000032 A1 | 3/2001 | Smith et al. |

* cited by examiner

*Primary Examiner*—Khiem Nguyen
(74) *Attorney, Agent, or Firm*—Robert L. Shaver; Frank J. Dykas; Stephen M. Nipper

(57) ABSTRACT

A grid interposer for testing electrical circuits and a method of making a grid interposer. The grid interposer includes upper and lower conductive surfaces sandwiched on either side of an insulating later, connected to each other by a plurality of vias filled with conductive material. The conductive surfaces are flat topped, and incised with a grid of flat topped peaks which are small enough to cut through oxidation of electrical contacts, and ensure good electrical contact with a variety of electrode shapes.

18 Claims, 10 Drawing Sheets

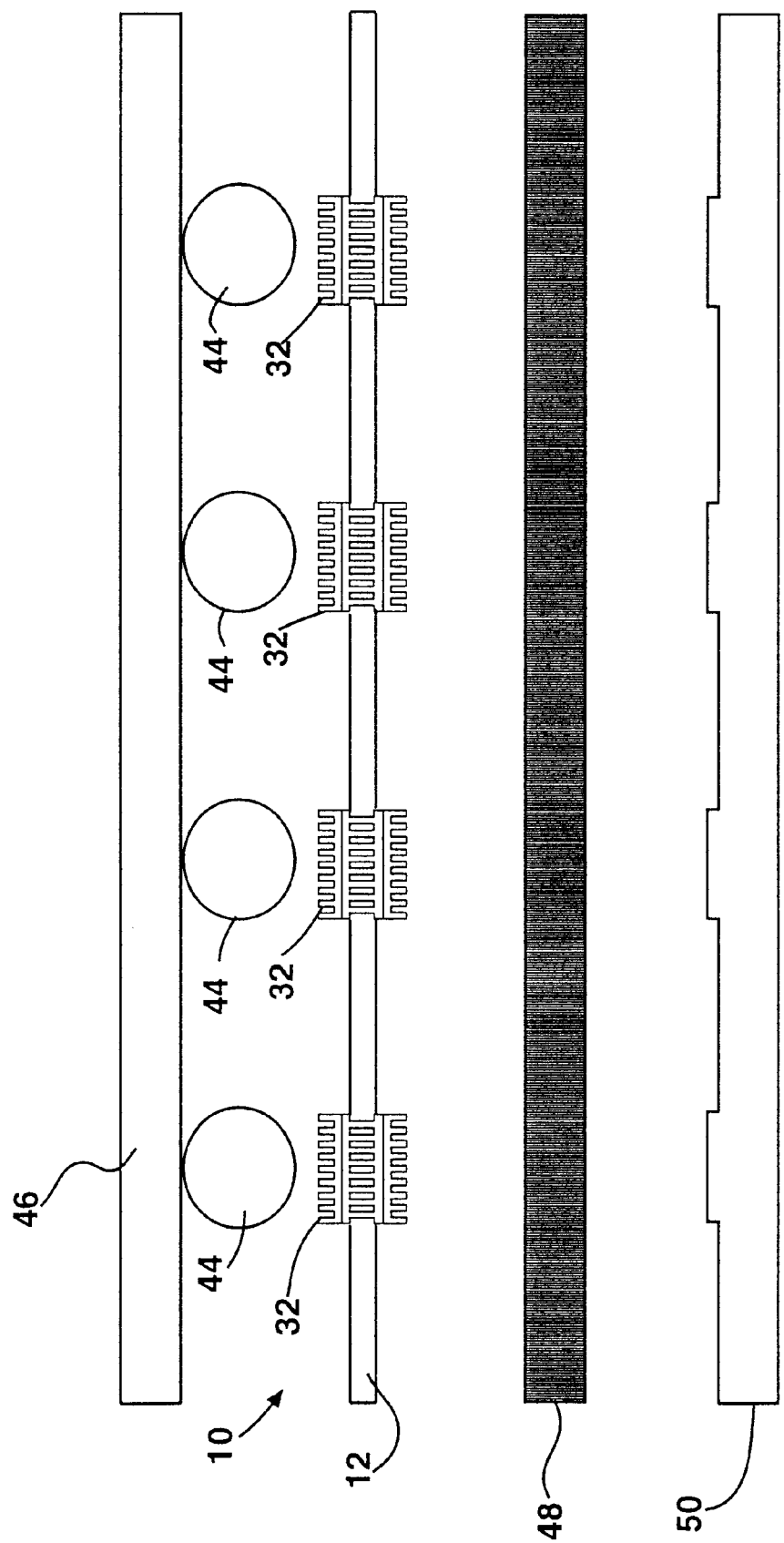

GRID INTERPOSER

REFERENCE TO RELATED APPLICATION

This application is a utility application claiming the priority of provisional application Ser. No. 60/238,197, filed Oct. 4, 2000, entitled Grid Interposer.

BACKGROUND OF THE INVENTION

1. Field of the Invention

The present invention generally relates to high density micro miniaturized electronic circuit devices. More particularly, this invention relates to an interposer for establishing electrical connection between components.

2. Background Information

Part of the process of manufacturing Integrated Circuits (ICs) involves testing them to be sure the circuitry of the IC functions as planned. In order to do this, the electrical connections of an IC are electrically connected the test equipment through an interposer. The type of connection between the IC and the test equipment varies with the design of the IC. ICs which have projecting probes or leads are typically contacted by inserting pressure on the leads. Another design of ICs is an IC which has electrical connections on one side of the IC which could best be described as bumps, balls or contact pads and are typically contacted by inserting pressure on the ICs. The leads or bumps are quite small, and must have a clean electrical connection to the test equipment as well as to the circuit in which the IC will function when in use. In high frequency application the thickness of the interposer is critical. The thickness relates to the speed the interposer can transfer electrical signals. This speed of transfer is more critical at high frequencies than at lower frequencies. The thinner the interposer the faster the transfer of electrical signals.

The problem with establishing a clean connection with an IC which has lead or bump type electrodes is that all available conductors of which the electrode can be made are subject to corrosion, and form a thin layer of insulating oxide on the surface. This includes aluminum, copper, nickel, tin, or any other known conductor. (Gold does not form an oxide, and is a good conductor, but it is soft, wears out easily and is expensive). The problem has been to establish an electrical connection for a lead or bump type IC which penetrates the inevitable layer of corrosion to establish a clean electrical connection.

The current technology uses a device called an interposer, which provides an electrical contact between the IC and the test equipment. The interposer is about as big as a large postage stamp, and the electrical footprint of connectors are a group of conductive pads on the interposer, and are typically in a pattern to match the leads or bumps of the IC that is being tested. By contrast, the interposer of the invention creates a contact surface by cutting away material, not by adding material. This results in a thinner interposer, which transmits signals faster.

The conductive surfaces of currently used interposers use conductive regions that are basically a deliberately roughened surface, to punch through the layer of corrosion. The roughened surface is formed of small metallic beads, which are attracted to a region, and fixed in place. The small metallic beads are typically very hard, and are coated with a layer of hard conductive metal such as nickel. When the electrode of an IC is pressed against the region of small metallic beads, the beads act like small needles, and cut through the layer of oxidation. This is achieved by the height of some of the beads being greater than the surrounding matrix, so that more pressure is applied through the highest regions of beads, which enables them to cut through the oxidation. A problem with this method is that the dispersion of metallic beads over the regions of contact is somewhat irregular, and there can be void regions in which there are no metallic beads, and build-up regions in which small stacks or piles of beads make a mini mountain. This is undesirable because the random small stacks over the IC footprint cause some conductors on the IC not to make electrical connection.

SUMMARY OF THE INVENTION

My invention is a thin film interconnect between the IC and test equipment, IC and load board, IC and printed circuit assemblies and the method of making it. This thin film interconnect creates a contact surface which will cut through the oxidation layer of the conductive metals, form a clean and predictable electrical connection with ICs pads, will last a long time, not damage electrodes, and forms a solderless interchangeable connection. This surface is made of a copper material, in which shallow grooves are formed, leaving a number of flat-topped peaks on the surface. Although the peaks are flat topped, they are very small in size, and have proven effective at cutting through the oxidization of metal conductors.

The top of the peak is typically flat on top with square sides and the peaks are coplanar. The top of the peak is approximately 0.001×0.001 inches in size. The peaks are typically on centers of 0.003 to 0.006 inches. The valleys between the peaks can be cut using a laser set to a power which ablates but does not penetrate the copper of the electrode. The valleys between the peaks can also be cut using a microsaw, or other physical device. They can also be etched using a number of chemical means which are standard in the industry. The grids thus formed are positioned in a thin film interconnect for placement between the conductors of an IC and a testing or production mounting.

The flat top peaks are cut in a layer of copper which forms a sandwich of copper around an inner layer of insulating flexible material. Thus there are flat top peaks in an upper layer, which face away from the inner layer. There are also flat top peaks in a lower layer which face away from the inner insulating layer. The upper and the lower layer are connected to each other by a number of copper connections, which pass through vias through the insulating layer.

BRIEF DESCRIPTION OF THE DRAWINGS

FIG. 4 shows a typical cross section of the IC, thin interposer, conductive elastomer, and load board.

DESCRIPTION OF THE PREFERRED EMBODIMENTS

Figure 1:
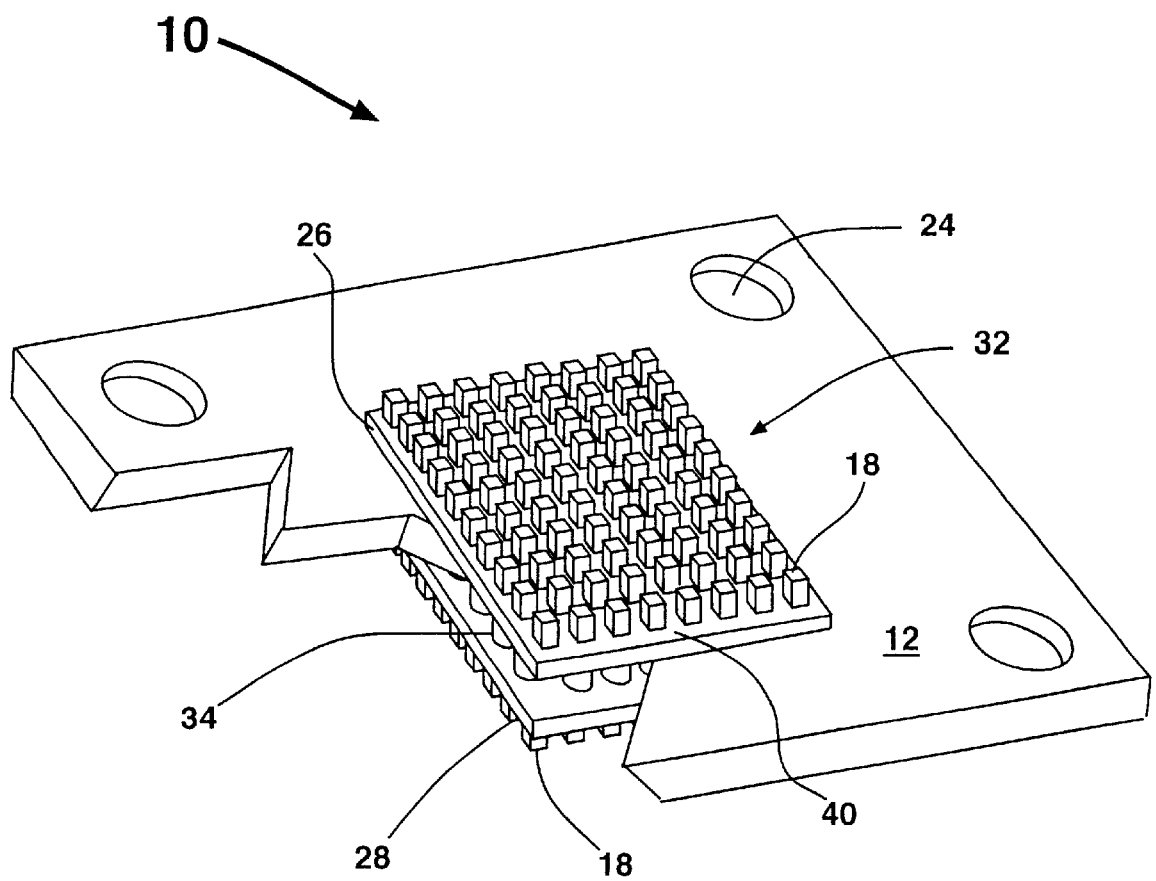
FIG. 1 is a perspective view of the grid interposer of the invention.

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

One preferred embodiment of the invention is shown in the Figures. FIG. 1 shows a cut away perspective of a grid interposer 10 which has one conductive pad 32 mounted on an insulating layer 12. The upper pad body 26 is shown above the insulating layer 12, and the lower pad body below the insulating layer 12. The upper and lower pad bodies 26 and 28 are connected by connecting bars 34. The upper and lower pad bodies 26 and 28 include contact posts 18, which are separated from each other by valley profiles 40. The insulating layer 12 has defined within it a number of orienting receivers 24. These would interact with corresponding posts on an IC test machine, for stabilizing and positioning the grid interposer 10. A more typical grid interposer 10 would contain more than one contact pad 32, and might contain a large number of such pads. The position of the conducting pads 32 would correspond to the bumps or contact points of the integrated circuit to be tested.

Figure 2:
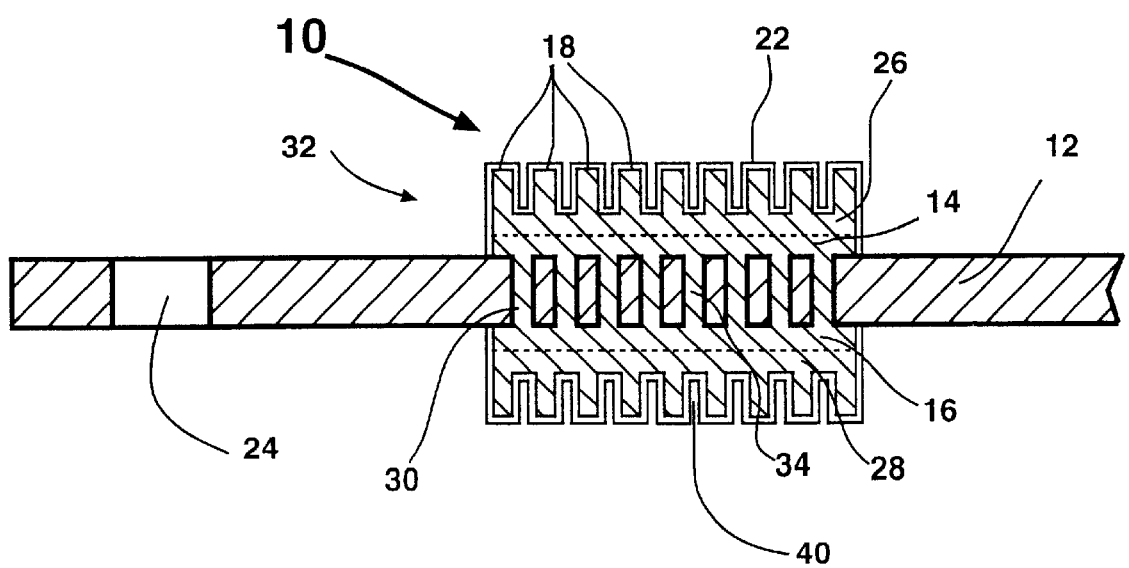
FIG. 2 is a cross section of the grid interposer.

FIG. 2 shows a cross section of a grid interposer 10, and a conductive pad 32. The insulating layer 12 is penetrated by connecting bars 34 which join the upper pad body 26 and the lower pad body 28. Contact points 18 are located on the upper pad body 26 and lower pad body 28, and are separated by valley profiles 40. The pathways through the insulating layer 12 through which the connecting bars 34 pass are called vias 30. The insulating layer 12 also defines an orienting receiver 24, which would interfit with a positioning projection on a testing machine. The current method is to use FR4, Kapton, or other commonly used insulating materials as the insulation layer 12. The insulating layer 12 is 0.002 to 0.012 inches thick. A typical configuration of the grid interposer is as a flat pad 32 which can be fabricated to any shape: round, square or rectangular are typical shapes. The point contacts 18 of the conductive pads 32 are about 1 mil square on a 4–6 mil center. The contact points are typically square but can be any shape. The vias 30 are 0.5 to 2.0 mils in diameter on a 4–6 mils center. Although the grid interposer can interface with balls, it can also interface with many other surfaces of electrical connections, unlike other inventions. Typically, the upper pad body 26 and lower pad body 28 are coated with a metallic layer 22, for improved conductivity and wear characteristics. This metallic layer 22 is optimal.

Figure 3A:
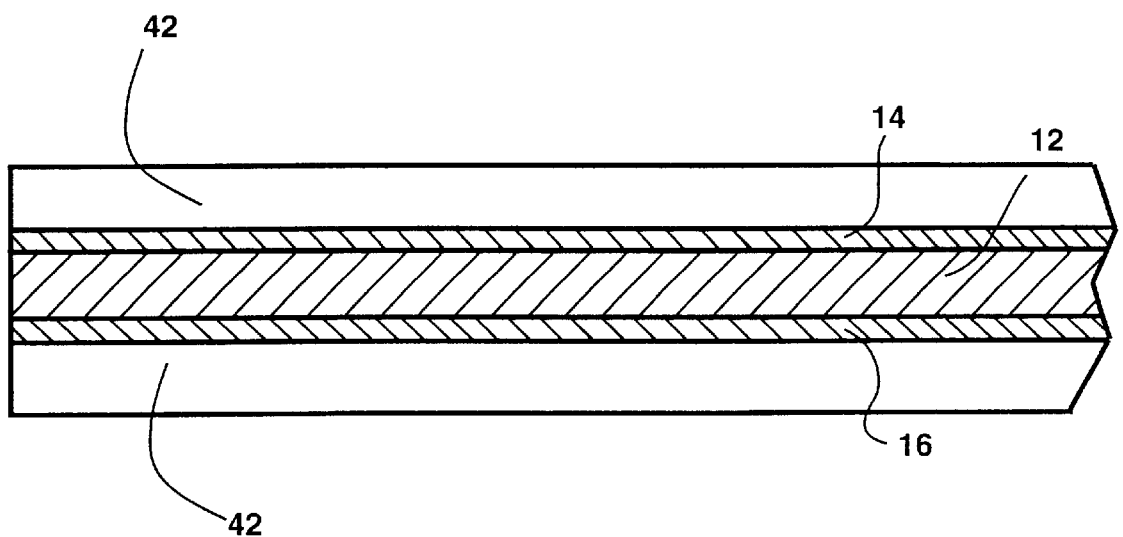
FIG. 3A is a cross sectional figure showing the beginning stage of formation of the grid interposer.

FIGS. 3A through 3F illustrate a preferred method by which the grid interposer 10 of the invention, with its conductive pads 32 is made. The grid interposer could be made by a number of conceivable methods, but this method has proven particularly useful. FIG. 3A shows the start of a process in which an insulating layer 12 is sandwiched between an upper conductive layer 14 and a lower conductive layer 16. The upper conductive layer 14 and the lower conductive layer 16 are preferably 0.0005 to 0.003 inches thick. The insulating layer 12 is typically 0.002 to 0.012 inches thick. Throughout this process, both the upper conductive layer 14 and the lower conductive layer 16 are treated identically. Although the grid interposer shown in the figures, and the process for making it shown, utilizes contact posts 18 on both sides, the process can be done on a single side for special applications. Over the upper conductive layer 14 and the lower conductive layer 16, a layer of photoresist 42 or similar chemically resistant material is deposited. The upper and lower conductive layers 14 and 16 are typically copper.

Figure 3B:
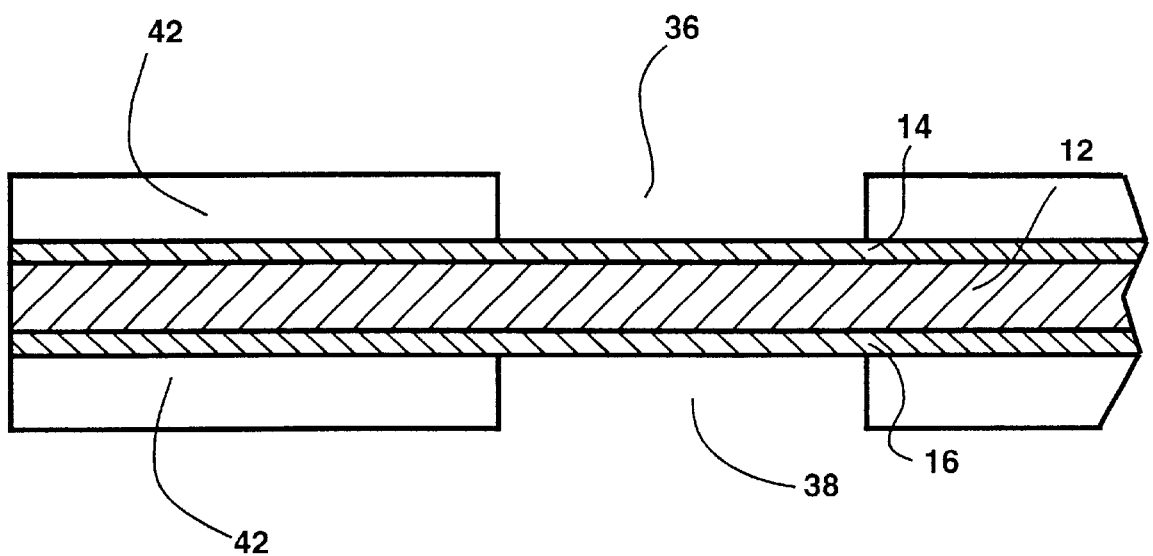
FIG. 3B shows a region of photoresist removed.

In FIG. 3B, the photoresist layers are selectively removed within a first defined region 36 and a second defined region 38. Within these regions, the photoresist layers are removed using conventional methods until the upper conductive layer 14 and the lower conductive layer 16 are exposed.

Figure 3C:
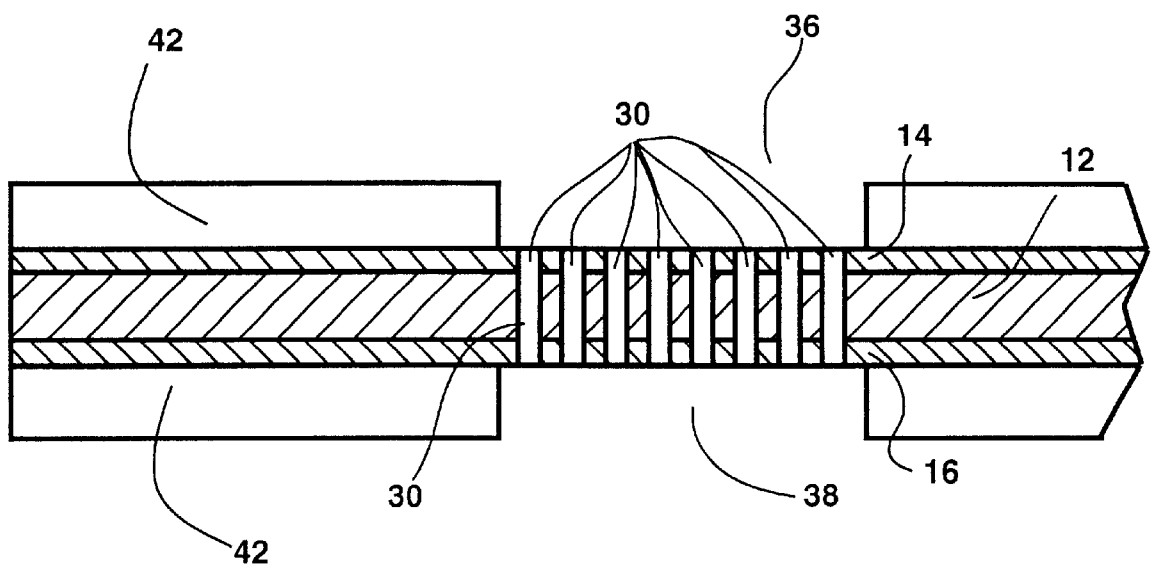
FIG. 3C shows vias cut in the internal layers of the grid interposer.

As shown in FIG. 3C, the photoresist layers 42 are thus removed within the defined regions, and vias 30 are drilled through the insulating layer 12, the upper conductive layer 14 and the lower conductive layer 16, forming through passageways which penetrate these three layers. The diameter of the vias is from 0.0005 to 0.002 inches in diameter, with 0.001 inches being the preferred diameter on a 0.003 to 0.006 inches center.

Figure 3D:
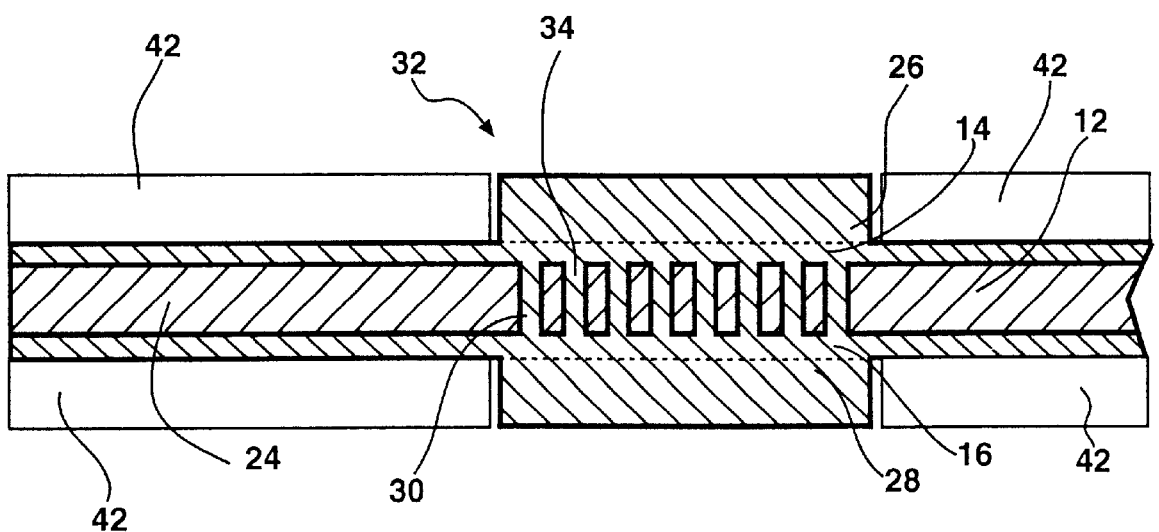
FIG. 3D shows upper and lower contact pads formed within defined regions of the grid interposer.

In FIG. 3D, the first defined region 36 and the second defined region 38 are the site of deposition of conductive material, preferably copper. This deposition fills the vias 30, and the region from the upper conductive layer 14 to the top of the photoresist layer 42, and from the lower conductive layer 16 to the top of the photoresist layer 42. The filling by this conductive material forms connecting bars 34, which fill the vias 30. The connecting bars electrically and mechanically join the upper conductive layer 14 and the lower conductive layer 16. The fill material thus forms an upper pad body 26 and a lower pad body 28 as shown in FIG. 3D. The deposition material does not fill completely to the edge of the photoresist 42, and a small gap remains between both the upper pad body 26 and the lower pad body 28, and the photoresist 42.

Figure 3E:
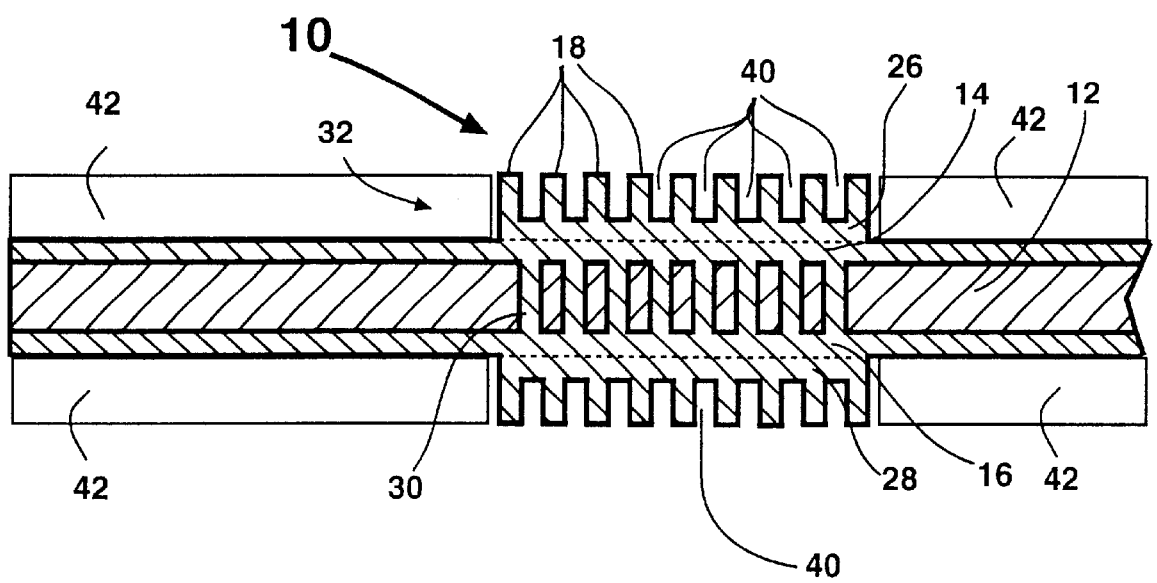
FIG. 3E shows contact posts formed by the removal of valley profiles from the pad bodies.

In FIG. 3E, valley profiles 40 are removed, which isolates and forms by isolation a plurality of contact posts 18. A typical conductive pad 32 would be comprised of a grid of such contact posts 18. The number of contact posts 18 on a conductive pad 32 would vary with the size of the electrical connection to be made. The grid interposer is designed to interface with any size of pads, balls or leads used on an IC device. Preferably, the contact posts 18 are in cross section with a flat top, but could be made in any shape, such as round or hexagonal. The contact post is preferably 0.001 by 0.001 inches on the side, and preferably 0.003 to 0.006 inches from center to center. The contact posts can be from 0.001 inches in diameter and up. The center to center distance between the contact posts can vary greatly, and thus the location of the typical conductive pad 32 could also vary greatly. Standard metric sizes by which the conductive pads are typically spaced are 1.27 millimeters, 1.0 millimeters, 0.8 meters, 0.65 millimeters, 0.5 millimeters, 0.4 millimeters and 0.25 millimeters. The valley profiles 40 are preferably cut with a laser, which is set to a power which ablates but does not penetrate the material of the electrode. The preferred material for the conductive pad 32, the upper conductive layer 14, the lower conductive layer 16 and the connecting bars 34 is copper. The valley profiles can also be cut using a microsaw or other physical device. They can also be etched using a number of chemical means which are standard in the industry.

Figure 3F:
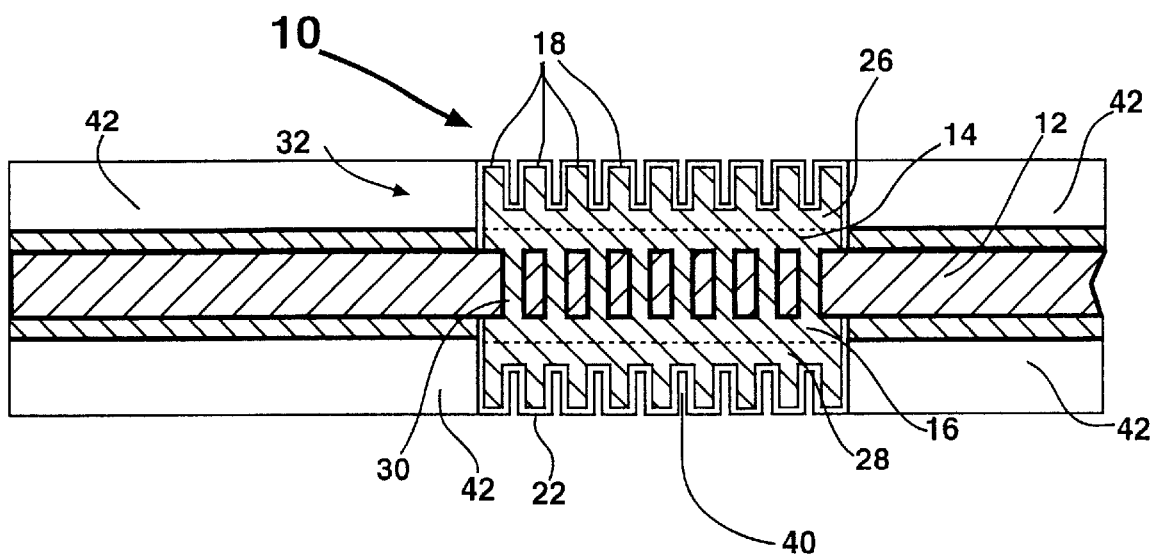
FIG. 3F shows a conductive metallic coating added to the conductive pad.

The next step is shown in FIG. 3F and is the addition of a conductive metallic coating 22 to the outside surfaces of the conductive pad 32. As shown in the figures, there is a small gap between the photoresist layer 42 and the upper pad body 26 and the lower pad body 28. The conductive metal coating 22 fills this gap, and covers the grid interposer as shown in FIG. 3F. This conductive metallic coating 22 can be made from nickel, palladium, silver, rhodium, or other commonly used materials. Palladium may be particularly desirable because it does not stick to the tin/lead which is contained in solder, and therefore stays cleaner in use. From tests conducted on this device, the grid interposer can withstand up to 360,000 uses or hits between cleanings. However, the type of material on the pads of the device under tests greatly affects the cleaning requirements. If the pads have tin/lead, then the grid interposer of the invention has to be cleaned sooner than the pads of nickel or gold.

A preferred final step is the removal of the photoresist layers 42 and etching away or removal by other means of the upper conductive layer 14 and the lower conductive layer 16 located outside of the first defined region 36 and the second defined region 38. In this etching, the conductive metallic coating 22 is not etched away, and protects the underlying material of the upper pad body 26 and lower pad body 28. This results in the formation of a workable conductive pad 32 and grid interposer 10, as shown in FIG. 2. After the photoresist layers are removed, one or more orienting features may be formed in the insulating layers. One of these orienting features is shown in FIG. 2. In the case of FIG. 2, the orienting feature is a hole which interfits with a alignment pins on a DUT board, which is further shown in FIG. 5. The orienting features can be added at other steps in the process and the sequence of their placement is not critical.

FIG. 4 shows how the grid interposer 10 interfaces with an integrated circuit 46. The integrated circuit has contact pads 44, which can be pads, balls, or leads. The grid interposer 10 is sandwiched between the contact pads 44 of the integrated circuit 46 and a layer of conductive elastomer 48. The conductive elastomer is optional. The conductive elastomer is configured to conduct electricity only in a vertical direction, passing current from one side of the conductive elastomer 48 to the other. This is generally achieved by the conductive elastomer pad 48 being made of insulating material 0.008 inches to 0.020 inches thick, impregnated with vertically oriented copper wires or round spheres oriented in a column, or other means for conducting electricity only vertically. Below the conductive elastomer pad 48 is located the load board 50 also known as the device under test "DUT" board.

Figure 5:
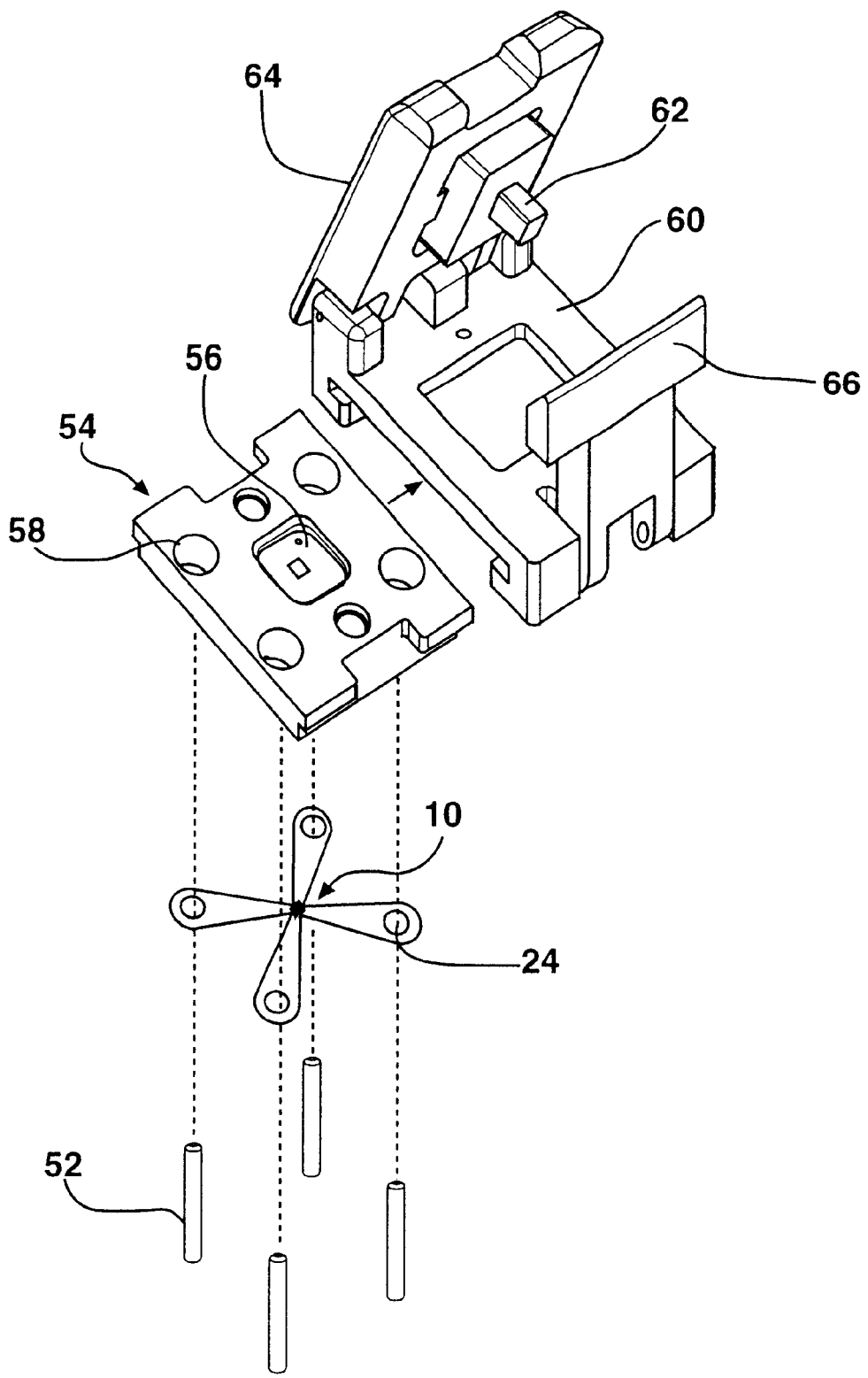
FIG. 5 shows a typical application of the grid interposer using a manual type socket.

FIG. 5 shows one particular installation with the grid interposer 10 being positioned in equipment for use. Alignment pins 52 are mounted on a "DUT" board. The grid interposer 10 is mounted on the alignment pins 52 by the orienting pin receiver 24 on the grid interposer 10. On top of the grid interposer 10, is mounted the socket base 54, which has alignment holes 58. An opening in the center of the socket base 54 is provided, and is called the alignment feature 56. The alignment feature 56 provides accurate alignment and access to the conductive pad 32 of the grid interposer 10. In an automated testing configuration, a chip is pressed into alignment feature 56 and comes in contact with the grid interposer 10, and through the grid interposer 10 with the load board 50. Using this configuration, a large number of chips can be tested using the grid interposer with the socket base 54. Approximately 360,000 chips would typically be tested before the grid interposer 10 would have to be cleaned. However, the type of material on the pads of the device under test greatly affects the cleaning requirements. If the pads have tin/lead, the grid interposer 10 would have to be cleaned sooner than if the pads were made of nickel or gold.

Socket lid assembly 60 may also be optionally used. This would be more likely to be used in an engineering or research and development situation, in which a single chip is mounted in the socket lid assembly 60 for testing on the load board 50. The socket lid assembly 60 includes a compression foot 62 attached to a hinged lid 64. The hinged lid 64, in this particular configuration, interfaces with a latch 66. When a circuit to be tested is in position in the alignment feature 56, the socket lid assembly 60 slides laterally into place on the socket base 54 with a tongue and grove rail system. The hinge lid 64 is lowered so that the compression foot 62 presses the circuit into place with the correct grams of force in order to achieve good electrical contact. The latch 66 is engaged to hold the hinged lid 64 in place until the testing is done. The grid interposer 10 can be used in similar and equivalent applications using different testing equipment than the socket base 54 and the socket lid assembly 60, which are only shown as illustrative of one particular testing situation.

The grid interposer 10 is placed over a contact region, with a ground plain and pads. It is positioned using orienting receivers, and clamped in place by a number of currently used methods. This device can be used in IC test equipment or in a production mode or consumer devices, depending on the circumstances. In a testing mode, when an interposer wears out, it can be easily changed. The grid interposer 10 is particularly useful for ICs which utilize a high frequency. The grid interposer 10 can also be used to test ICs which operate at a lower frequency. The interposer thus provides a solderless accurate connection for all types of ICs. The bandwidth of the grid interposer is up to 10 Ghz.

From the foregoing description, it will be apparent that various changes may be made without departing from the spirit and scope of the invention as defined by the following claims.

I claim:

1. A grid interposer for use with integrated circuit components, which comprises:
    a planar insulating layer which defines a plurality of vias through said insulating layer, and which includes one or more orienting features;
    at least one conductive pad comprising;
        an upper pad body superior to said insulating layer, which includes a plurality of contact posts extending away from said insulating layer;
        a lower pad body inferior to said insulating layer, which includes a plurality of contact posts extending away from said insulating layer; and
        a plurality of connecting bars which extend through said vias and which are contiguous with said upper pad body and said lower pad body, and which electrically and mechanically join said upper pad body and said lower pad body in a rigid connection which in use does not compress said insulating layer when in operative contact with said integrated circuit components;
    wherein said one or more conductive pads of said grid interposer provide electrical contact with an IC component in contact with said contact posts of said upper pad body and with an IC component in contact with said contact posts of said lower pad body, by penetration of an oxidation layer on said IC components by said contact posts, and said grid interposer is placed in a contact position by the use of said one or more orienting features of said planar insulating layer.

2. The grid interposer of claim 1 in which said upper pad body, said lower pad body, and said connecting bars are made of copper.

3. The grid interposer of claim 1 in which said contact posts are generally flat sided on a side distal from said insulating layer.

4. The grid interposer of claim 1 in which said contact posts are generally square in cross section.

5. The grid interposer of claim 1 in which said contact posts are coated with a conductive metallic coating.

6. The grid interposer of claim 5 in which said conductive metallic coating is selected form the group which includes nickel, palladium, silver, or rhodium.

7. The grid interposer of claim 1 in which said insulating layer is FR4.

8. The grid interposer of claim 1 in which said insulating layer is Kapton.

9. The grid interposer of claim 1 in which said one or more orienting features comprises one or more orifices defined by said insulating layer which interfit with protruding posts on an IC tester.

10. The grid interposer of claim 1 in which said one or more orienting features comprises one or more projections in said insulating layer which interfit with receivers in an IC tester.

11. A grid interposer for use with integrated circuit components, which comprises:
    a planar insulating layer which defines a plurality of vias through said insulating layer, and which includes at least one orienting feature;
    one or more conductive pads comprising;
        an upper pad body superior to said insulating layer, which includes a plurality of flat topped contact posts, and which extend away from said insulating layer;
        a lower pad body inferior to said insulating layer, which includes a plurality of flat topped contact posts, and which extend away from said insulating layer; and
        a plurality of connecting bars which penetrate said vias and which are contiguous with said upper pad body and said lower pad body, and which electrically and mechanically join said upper pad body and said lower pad body;
    wherein said one or more conductive pads of said grid interposer provide electrical contact with an IC component in contact with said contact posts of said upper pad body and with an IC component in contact with said contact posts of said lower pad body by penetration of an oxidation layer on said IC components by said contact posts, and is placed in a contact position by the use of said one or more orienting features of said planar insulating layer.

12. A method of making a grid interposer for use with integrated circuit components, which comprises the steps of:
    enclosing an insulating layer between an upper and a lower conductive layer, with said upper conductive layer having an exterior surface, and said lower conductive layer having an exterior surface;
    adding photoresist layers to said exterior surfaces of said upper and said lower conductive layers;
    selectively removing said photoresist layers from one or more first defined region and from one or more corresponding second defined region, so that said photoresist layers are selectively removed from said exterior surface of said upper and said lower conductive layer only within said one or more first defined regions of said upper conductive layer and within said corresponding one or more second defined regions of said upper conductive layer;
    forming vias within said first and second defined regions which penetrate said upper conductive layer, said inner insulating layer, and said lower conductive layer;
    filling said vias with a layer of conductive material, forming connecting bars of conductive material which penetrate said insulating layer, and which electrically connect said upper and said lower conductive layers, and which also forms a first pad body on said upper conductive layer and a second pad body on said lower conductive layer, within each of said one or more first and second defined regions;
    cutting a plurality of valley profiles in said first and said second pad bodies which form by isolation a plurality of contact posts from each of said first and said second pad bodies;
    adding a conductive metallic layer to said upper and lower conductive layers, and said contact posts;
    removing said photoresist layer from said upper conductive and said lower conductive layers;
    removing said upper and said lower conductive layers outside said first and said defined regions to expose said insulating layer; and
    forming one or more orienting features in said insulating layer for aiding in positioning said grid interposer in use.

13. The method of making a grid interposer of claim 12 in which said upper and said lower conductive layer are made of copper.

14. The method of making a grid interposer of claim 12 in which said insulating layer is made of FR4.

15. The method of making a grid interposer of claim 12 in which said insulating layer is made of Kapton.

16. The method of making a grid interposer of claim 12 in which said contact posts are generally flat topped on a side distal from said insulating layer.

17. The method of making a grid interposer of claim 12 in which said contact posts are generally square in cross section.

18. The method of making a grid interposer of claim 12 in which said conductive metallic coating is selected from the group which includes nickel, palladium, silver, or rhodium.

* * * * *